United States Patent [19]

Binard

[11] 4,454,407

[45] Jun. 12, 1984

[54] EXTENDABLE MODULAR VACUUM CHAMBER

[75] Inventor: Jean Binard, Montchanin, France

[73] Assignee: Creusot-Loire, Paris, France

[21] Appl. No.: 395,377

[22] Filed: Jul. 6, 1982

[30] Foreign Application Priority Data

Aug. 13, 1981 [FR] France .................................. 81 15671

[51] Int. Cl.³ ............................................. B23K 15/00
[52] U.S. Cl. .............................. 219/121 EL; 220/4 R;
220/4 F; 219/121 EN
[58] Field of Search .................. 219/121 EL, 121 EN,
219/121 EP, 121 EB, 121 EM; 220/4 A, 4 R, 4
D, 4 F, 83; 229/18; 46/23, 24

[56] References Cited

U.S. PATENT DOCUMENTS

| 3,493,711 | 2/1970 | Terselic et al. | 219/121 EL X |
| 3,497,665 | 2/1970 | Gerard | 219/121 EL X |
| 3,925,959 | 12/1975 | Dykes et al. | 46/24 X |

*Primary Examiner*—C. L. Albritton
*Attorney, Agent, or Firm*—Pollock, Vande Sande & Priddy

[57] ABSTRACT

Extendable Modular Vacuum Chamber made up by:
a parallelepipedal rigid box in two identical parts (1,2) which are separable along a plane passing through the diagonals (14,15) of two opposing parallel faces (5,7),
at least one rigid frame (3) which can be interfitted between the two parts (1,2).

The invention applies to vacuum chambers for carrying out electron beam welding.

4 Claims, 11 Drawing Figures

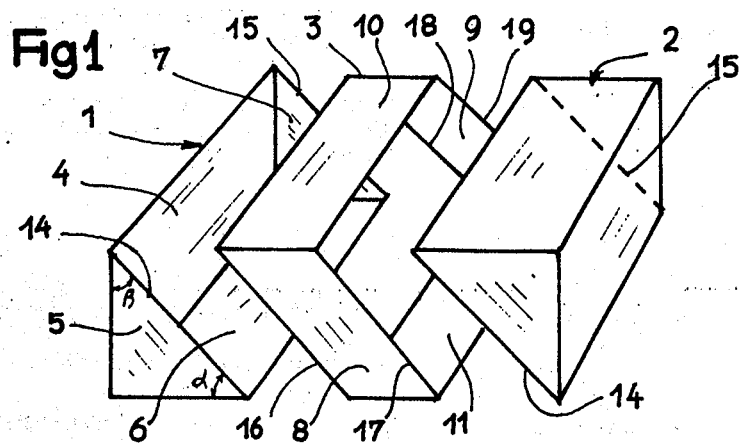
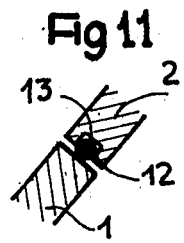
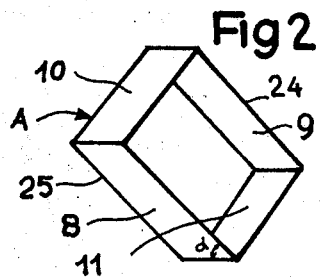
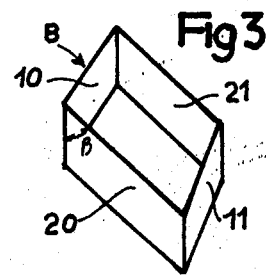
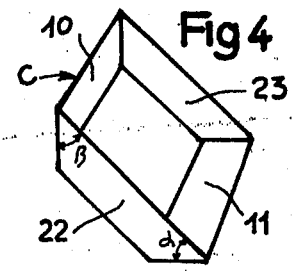
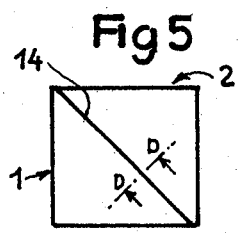
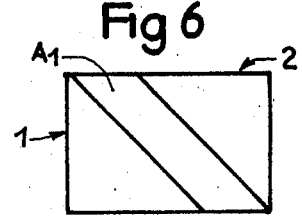
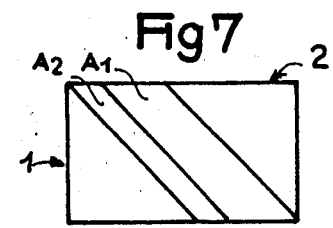
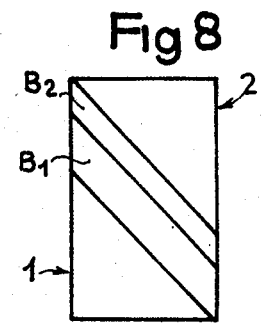
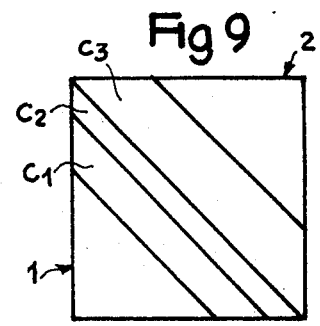
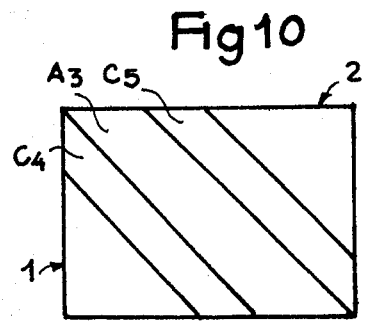

EXTENDABLE MODULAR VACUUM CHAMBER

BACKGROUND

The present invention relates to an extendable modular vaccum chamber which can for example be used when carrying out electron beam welding.

In electron beam welding installations, the parts to be welded are generally placed in a sealed chamber from which the air is removed. This chamber, commonly referred to as a "vaccum chamber", must have dimensions which are larger than those of all the parts which are to be welded, and must include an opening through which the parts to be welded can be introduced, and which is sealed prior to providing the vaccum inside it.

PRIOR ART

In such welding installations using electron beams, the time necessary to pump down the chamber is relatively long if it is wished to obtain a high vaccum. Obviously, the larger the volume of the chamber, the greater is the pumping time required, and it is consequently appropriate to provide a vacuum chamber of minimum dimensions. The vacuum chamber must have dimensions which are greater than those of the largest complete assembly of the parts to be welded. This means that, when it is desired to weld a part of small dimensions, the vacuum chamber is then appreciably larger than necessary, and the pumping time required is relatively long. It is possible to make available several vacuum chambers having differing dimensions, for the same piece of electron beam welding equipment, so as to be able to adapt the dimensions of the vacuum chamber to the space occupied by the part to be welded. Generally, these vacuum chambers are of parallelepiped shape and must possess differing length, width and height dimensions if they are to be adaptable to parts of every shape, and it is consequently necessary to provide a fairly large number of chambers.

The use of a telescopic vacuum chamber is also impractical since it would involve practically insurmountable sealing and rigidity problems. Furthermore, such a vacuum chamber could only be extended along a single one of its dimensions.

It would consequently appear useful to devise a vacuum chamber which could be extended along one or several of its dimensions and which could be made up of a set of modular components which could be rigidly assembled in different manners in order to constitute the vacuum chamber of differing dimensions.

SUMMARY OF THE INVENTION

The present invention provides such an extendable modular vacuum chamber.

In accordance with one essential characteristic of the invention, the extendable modular vacuum chamber comprises (1) a rigid box of parallelepiped shape made in two identical separable parts, the plane of separation of the two parts of this box passing both along a diagonal line situated on a first face of the box and along a diagonal line situated on the other face of the box parallel to this first face, and (2) at least one rigid frame which can be inserted between the two parts of said box in order to constitute, together with these parts, another rigid box of which at least one dimension is greater than that of the initial box.

The rigid frame(s) are constituted either by two parallel faces in the form of a parallelogram connected by two further parallel faces in the shape of a rectangle, or by two parallel faces in the shape of a trapezium connected by two perpendicular faces having a rectangular shape.

BRIEF DESCRIPTION OF THE DRAWINGS

Further advantages will become more clear from the following description which refers to several embodiments provided by way of example and which is illustrated in the attached drawings.

FIG. 1 is an exploded view in perspective of a vacuum chamber in accordance with the invention.

FIG. 2 is a perspective view of a first shape of a rigid frame.

FIG. 3 is a perspective view of a second shape of a rigid frame.

FIG. 4 is a perspective view of a third shape of a rigid frame.

FIGS. 5 to 10 are front views of various possible assemblies of the vacuum chamber.

FIG. 11 is a partial view in section along line D—D in FIG. 5.

DETAILED DESCRIPTION

FIG. 1 shows three parts 1,2,3 which together constitute one of the possible assemblies yielding the vacuum chamber. Part 1, forming a base, and part 2, forming a cover, are of identical shape and each comprise a horizontal rectangular plate 6 and a vertical rectangular plate 4 connected rigidly with edge-to-edge contact to plate 6, and by two lateral plates 5,7 each in the shape of a right-angled triangle and rigidly connected, by their edges forming the sides of the right angle, to the respective lateral edges of the plates 4 and 6 situated on one and the other side. These two identical parts 1,2 thus constituted can then be assembled, as shown in FIG. 5, in such a way as to constitute a rigid box of parallelepiped shape made of two identical parts 1,2, which are separable, the plane of separation of the box passing along a diagonal line 14,15 situated on both of the two parallel faces 5,7 of the box.

A possible assembly, which is shown in FIG. 1, also includes as a part 3 in the form of a rigid frame inserted between parts 1 and 2 in order to constitute together with them a rigid box at least one dimension of which is greater than that of the rigid box formed by using only parts 1 and 2. Obviously, the assembly constituted by the three parts 1,2 and 3 forms the vacuum chamber only when these three parts are assembled together edge-to-edge in a sealed manner, the edges 14 and 15 of each part 1 and 2 contacting, respectively, the corresponding edges 16,17,18 and 19 of part 3.

In order to constitute vacuum chambers of differing dimensions, the invention contemplates use of a plurality of intermediate parts 3 having variable shapes and dimensions, as shown, by way of example, in FIGS. 2, 3 and 4. A first shape, A, of part 3, represented in FIG. 2, consists of a rigid frame made up of two identical rectangular plates 10,11 parallel to each other and connected at their lateral edges to two parallel plates 8,9 in the shape of a parallelogram, the two borders 24 and 25 of this frame being situated in two parallel planes. This frame A possesses an inclination α which is equal to the inclination α of the edge 14 of the base 1 (FIG. 1).

A second shape, B, of part 3, represented in FIG. 3, is made up in the same fashion of two rectangular plates 10,11 which are parallel and connected by two parallel plates 20,21 in the form of a parallelogram. The angle β made by this frame is equal to the inclination β of the edge 14 with respect to the vertical of base 1 (FIG. 1).

A third shape, C, of frame 3, represented in FIG. 4, is made up of two rectangular plates 10,11 arranged perpendicularly, connected by two parallel plates 22,23 in the shape of a trapezium. The angle α of this trapezium is equal, on the base 1, to the inclination α of the edge 14 with respect to the horizontal, and the angle β of this trapezium is equal, on the base 1, to the inclination β of the edge 14 with respect to the vertical.

FIGS. 5 to 10 show different examples of possible constructions of the vacuum chamber. FIG. 5 shows the vacuum chamber of minimum volume, simply constituted by the base 1 and the cover 2. FIG. 6 shows a vacuum chamber the width of which has been increased, and this includes an intermediate frame $A_1$ the shape of which corresponds to that represented in FIG. 2. FIG. 7 shows a vacuum chamber which has been further enlarged in width, including several intermediate frames $A_1$, $A_2$. FIG. 8 shows a vacuum chamber in which the height has been simply increased and this includes several intermediate frames $B_1$, $B_2$, conforming in shape to frame B represented in FIG. 3. FIG. 9 shows a chamber in which both the width and height have been enlarged, and this includes several frames $C_1$, $C_2$, conforming in shape to frame C represented in FIG. 4. FIG. 10 shows a vacuum chamber the width and height of which have both been increased by using a combination of intermediate frames $C_4$, $C_5$ of a shape corresponding to frame C in FIG. 4, and one frame $A_3$ of a shape corresponding to frame A in FIG. 2. It will be seen from these examples that it is possible to constitute, using a base 1, a cover 2, and a relatively small number of intermediate frames 3, in the manner of a constructional kit for children, a fairly large nnumber of vacuum chambers having dimensions which are variable is to both width and height.

If, for the parts 1 and 2, both angle α and angle β are equal to 45°, it will be readily seen that the frames of shape A and shape B are then actually congruent frame B being in fact a turned-over version of frame A. In this case, a smaller number of different parts are required to provide a large number of vacuum chambers of differing dimensions.

It is necessary to provide, on the edges of the various parts 1,2 and 3 which come into contact, sealing components, such as those shown in FIG. 11, so that the vacuum chamber thus constituted is sealed. One could for example provide, on certain of the edges of parts 1,2 and 3, a continuous groove 13 into which a circular seal 12 is fitted.

Moreover, it will be obvious that the parts 1, 2 and 3 described above, when used for building up vacuum chambers for carrying out electron beam welding, must include all the provisions necessary for this welding operation, e.g., the support and clamps for the parts to be welded, connectors for the pumps, and the connection for the apparatus subjecting the inside of the chamber to an electron beam.

It will be noted that assembly in the manner of a constructional kit of the varying vacuum chambers from a given set of parts 1,2 and 3 is not possible using just any part 3 taken from the parts 3 provided in the set. The operator who is assembling the parts in order to obtain a given vacuum chamber must arrange the intermediate parts 3 in such a fashion that each edge (16 to 19) of the parts 3 coming into mutual contact has identical dimensions, and that each edge of the parts 3 has dimensions which are identical to the edge of the parts 1 or 2 with which it comes into contact at the time of assembly.

If the intermediate parts 3 are all of the type A or B, the minimum number that can be used in an assembly is one (FIG. 6). If the parts 3 are all of the type C, their minimum number in an assembly is two (FIG. 9), and if the intermediate parts 3 are of two types A or B and C, the minimum number that can be used in an assembly is three (FIG. 10), at least two parts of type C and at least one part of type A.

I claim:
1. Extendable modular vacuum chamber particularly for electron beam welding, comprising
   (a) two identical separable parts (1, 2) each constituted by a rectangular horizontal plate (6) and rectangular vertical plate (4) in rigid edge-to-edge attachment thereto, and two lateral plates (5, 7) each in the shape of a right-angled isosceles triangle rigidly attached by their edges forming the sides of the right angle to the corresponding lateral edges of said plates (6, 4) located on either side thereof, whereby, upon assembly, said parts (1, 2) form a first rigid box of parallelepiped shape;
   (b) at least one rigid frame (3) for interposition between said parts (1, 2) whereby the assembly of said frame (3) with said parts (1, 2) constitutes a second rigid box of parallelepiped shape having at least one dimension larger than the corresponding dimension of said first box; and
   (c) sealing means at at least one contact point between the assembled elements.
2. Extendable modular vacuum chamber according to claim 1, wherein the at least one rigid frame (3) is constituted by two parallel faces (8, 9) in the shape of a parallelogram connected by two parallel rectangular faces (10, 11).
3. Extendable modular vacuum chamber according to claim 1, comprising at least two rigid frames each having two parallel faces (22, 23) in the shape of a trapezium connected by two rectangular faces (10, 11) which are perpendicular to one another.
4. Extendable modular vacuum chamber according to claim 1, comprising at least three rigid frames, at least one of these rigid frames having two parallel faces in the shape of a parallelogram connected by two parallel rectangular faces, and at least two of these rigid frames each having two parallel faces in the shape of a trapezium connected by two rectangular faces which are perpendicular to one another.

* * * * *